(12) United States Patent
Lee et al.

(10) Patent No.: US 9,047,964 B2
(45) Date of Patent: Jun. 2, 2015

(54) MULTI-LEVEL MEMORY CELL USING MULTIPLE MAGNETIC TUNNEL JUNCTIONS WITH VARYING MGO THICKNESS

(75) Inventors: Kangho Lee, San Diego, CA (US); Taehyun Kim, San Diego, CA (US); Jung Pill Kim, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 410 days.

(21) Appl. No.: 13/589,315

(22) Filed: Aug. 20, 2012

(65) Prior Publication Data

US 2014/0050019 A1    Feb. 20, 2014

(51) Int. Cl.
G11C 11/00 (2006.01)
G11C 11/16 (2006.01)
G11C 11/56 (2006.01)
H01L 21/00 (2006.01)

(52) U.S. Cl.
CPC ............ *G11C 11/16* (2013.01); *G11C 11/5607* (2013.01); *H01L 21/00* (2013.01)

(58) Field of Classification Search
USPC ......... 365/48, 55, 62, 66, 74, 78, 80–93, 100, 365/129, 130, 131, 148, 158, 171–173, 209, 365/213, 225.5, 230.07, 232, 243.5; 257/421, E21.665; 438/3; 977/933–935
See application file for complete search history.

(56) References Cited

U.S. PATENT DOCUMENTS

| 6,169,689 B1 | 1/2001 | Naji |
| 7,211,446 B2 | 5/2007 | Gaidis et al. |
| 7,239,545 B2 * | 7/2007 | Hosotani ........................ 365/171 |
| 7,368,299 B2 | 5/2008 | Lee et al. |
| 7,804,710 B2 | 9/2010 | Reohr |
| 7,863,060 B2 | 1/2011 | Belen et al. |
| 8,084,835 B2 | 12/2011 | Ranjan et al. |

(Continued)

FOREIGN PATENT DOCUMENTS

| EP | 1132919 A2 | 9/2001 |
| WO | 2005020242 A2 | 3/2005 |
| WO | 2008100872 A2 | 8/2008 |

OTHER PUBLICATIONS

International Search Report and Written Opinion—PCT/US2013/055171—ISA/EPO—Oct. 10, 2013.

(Continued)

*Primary Examiner* — Harry W Byrne
(74) *Attorney, Agent, or Firm* — Sam Talpalatsky; Nicholas J. Pauley; Joseph Agusta

(57) ABSTRACT

A Multi-Level Memory Cell (MLC) using multiple Magnetic Tunnel Junction (MTJ) structures having one or more layers with varying thickness is disclosed. The multiple MTJ structures, which are vertically stacked and arranged in series, may have substantially identical area dimensions to minimize fabrication costs because one mask can be used to pattern the multiple MTJ structures. Further, varying the thicknesses associated with the one or more layers may provide the multiple MTJ structures with different switching current densities and thereby increase memory density and improve read and write operations. In one embodiment, the layers with the varying thicknesses may include tunnel barriers or magnesium oxide layers associated with the multiple MTJ structures and/or free layers associated with the multiple MTJ structures.

65 Claims, 6 Drawing Sheets

(56) References Cited

U.S. PATENT DOCUMENTS

| | | |
|---|---|---|
| 8,125,040 B2 | 2/2012 | Kang et al. |
| 2005/0167657 A1 | 8/2005 | Nickel et al. |
| 2005/0237788 A1 | 10/2005 | Kano et al. |
| 2006/0221680 A1* | 10/2006 | Hosotani ................ 365/171 |
| 2007/0224707 A1* | 9/2007 | Hosotani ................ 438/3 |
| 2009/0261433 A1 | 10/2009 | Kang et al. |
| 2010/0258887 A1 | 10/2010 | Zhu et al. |

OTHER PUBLICATIONS

Uemura T., et al., "Proposal of four-valued MRAM based on MTJ/RTD structure", Proceedings 2003 33RD IEEE International Symposium on Multiple-Valued Logic. ISMLV 2003. Tokyo, Japan, May 16-19, 2003; [International Symposium on Multiple-Valued Logic. ISMLV], Los Alamitos, CA: IEEE Comp. SOC, US, May 16, 2003, pp. 273-278, XP010640342, DOI: 10.1109/ISMLV.2003.1201417 ISBN: 978-0-7695-1918-0 p. 2, right-hand column, last paragraph—p. 3, left-hand column, paragraph 1; figure 2.

Huai, "Spin-Transfer Torque MRAM (STT-MRAM)," Challenges and Prospects, AAPPS Bulletin, Grandis, Inc. Milpitas, USA, Dec. 2008, vol. 18, No. 6, pp. 33-40.

Ishigaki T., et al., "A Multi-Level-Cell Spin-Transfer Torque Memory with Series-Stacked Magnetotunnel Junctions," Symposium on VLSI Technology Digest of Technical Papers, Tokyo, Japan, 2010, pp. 47-48.

* cited by examiner

MULTI-LEVEL MEMORY CELL USING MULTIPLE MAGNETIC TUNNEL JUNCTIONS WITH VARYING MGO THICKNESS

FIELD OF DISCLOSURE

The present application generally relates to a Multi-Level Memory Cell (MLC) using multiple Magnetic Tunnel Junction (MTJ) structures, and in particular, to varying thicknesses associated with one or more layers in the multiple MTJ structures to minimize a cost to fabricate the MLC and improve operations to read and/or write the MLC while increasing memory density.

BACKGROUND

Magnetic Random Access Memory (MRAM) is non-volatile memory in which data is stored by programming a Magnetic Tunnel Junction (MTJ). MRAM is advantageous because the MTJ can be used to store information even when power is turned off. Data is stored in the MTJ as a small magnetic element (e.g., a magnetic state) rather than an electric charge or current, and the stored data can then be sensed by measuring resistance associated with the MTJ without disturbing the magnetic state. An exemplary MTJ 10 is illustrated in FIG. 1. Data is stored in the MTJ 10 according to the magnetic orientation between a free layer 12 and a pinned layer 14, which are magnetically polarized plates formed from a ferromagnetic material. The pinned layer 14 is a permanent magnet set to a particular polarity, while a polarity of the free layer 12 will change to match that of a sufficiently strong external field. The MTJ 10 is configured in a conventional "bottom-spin valve" configuration wherein the pinned layer 14 is disposed below the free layer 12. The free layer 12 and the pinned layer 14 are separated by a tunnel junction or barrier 16 formed from a thin non-magnetic dielectric layer. The free layer 12 and the pinned layer 14 can store information even when the magnetic H-field is '0' due to a hysteresis loop 18 of the MTJ 10. Electrons can tunnel through the tunnel barrier 16 if a bias voltage is applied between two electrodes 20 and 22 coupled on ends of the MTJ 10. The tunneling current depends on the relative orientation of the free layer 12 and the pinned layer 14. When using a Spin-Transfer Torque (STT) MTJ, the difference in the tunneling current as the spin alignment of the free layer 12 and the pinned layer 14 is switched between parallel (P) and anti-parallel (AP) states is known as the Tunnel Magnetoresistance Ratio (TMR).

When the magnetic orientation of the free layer 12 and the pinned layer 14 are of opposite polarization (shown in FIG. 1 as MTJ 10'), the anti-parallel (AP) state exists (e.g., a logical '1'). On the other hand, when the magnetic orientation of the free layer 12 and the pinned layer 14 are of the same polarization (shown in FIG. 1 as MTJ 10"), the parallel (P) state exists (e.g., a logical '0'). The magnetic orientation of the free layer 12 and the pinned layer 14 can be sensed to read data stored in the MTJ 10 by measuring the resistance that results when current flows through the MTJ 10, wherein the resistance will be low when the P state exists and the resistance will be higher when the AP state exists. Data can also be written and stored in the MTJ 10 by applying a magnetic field to change the magnetic orientation of the free layer 12 to either a P or AP magnetic orientation with respect to the pinned layer 14. In other words, as noted above, the magnetic orientation of the free layer 12 can be changed, but the magnetic orientation of the pinned layer 14 is fixed.

FIG. 2 illustrates an STT MTJ 23 (referred to herein as "MTJ 23") having a similar design to the MTJ 10 shown in FIG. 1 and described above. The MTJ 23 is provided as part of an MRAM bitcell 24 to store non-volatile data. The MRAM bitcell 24 may be provided in a memory array and used as memory storage for any type of system requiring electronic memory, such as a computer processing unit (CPU) or processor-based system, for example. A metal-oxide semiconductor (typically n-type MOS, i.e., NMOS) access transistor 26 is provided to control reading and writing to the MTJ 23. The access transistor 26 has a drain (D) coupled to a bottom electrode 22 of the MTJ 23, which is coupled to the pinned layer 14. A word line ($V_{WL}$) is coupled to a gate (G) of the access transistor 26, while a source (S) of the access transistor 26 is coupled to a voltage source ($V_S$). A bit line ($V_{BL}$) is coupled to a top electrode 20 of the MTJ 23, which is coupled to the free layer 12.

When reading data stored in the MTJ 23, the bit line ($V_{BL}$) is activated for the access transistor 26 to allow current to flow through the MTJ 23 between the top electrode 20 and the bottom electrode 22. As noted above, a low resistance, as measured by voltage applied on the bit line ($V_{BL}$) divided by the current flowing through the MTJ 23, is associated with a P orientation between the free layer 12 and the pinned layer 14, whereas a higher resistance is associated with an AP orientation between the free layer 12 and the pinned layer 14. As such, due to the tunneling magnetoresistance effect, the electrical resistance of the MRAM bitcell 24 varies depending on the relative orientation between the polarities of the free layer 12 and the pinned layer 14, whereby measuring the current that flows through the MTJ 23 when the bit line ($V_{BL}$) is activated may indicate the electrical resistance of the MRAM bitcell 24 and the relative orientation between the polarities of the free layer 12 and the pinned layer 14.

When writing data to the MTJ 23, the word line ($V_{WL}$) is activated to activate the gate (G) of the access transistor 26. A voltage differential between the bit line ($V_{BL}$) and the source line ($V_S$) is applied. As a result, a write current (I) is generated between the drain (D) and the source (S). To change the MTJ 23 from the AP state to the P state, a write current ($I_{AP-P}$) flowing from the top electrode 20 to the bottom electrode 22 is generated, which induces an STT at the free layer 12 to change the magnetic orientation of the free layer 12 to P with respect to the pinned layer 14. To change the magnetic orientation of the MTJ 23 from the P state to the AP state, a write current ($I_{P-AP}$) flowing from the bottom electrode 22 to the top electrode 20 is generated, in which case the STT induced at the free layer 12 changes the magnetic orientation of the free layer 12 to AP with respect to the pinned layer 14.

MRAM has the potential to be a promising memories solution for embedded systems, mobile systems, and other memory markets due to having less demanding requirements than standalone memory, including high density, high speed performance, high endurance, and small cell size, among other things. However, MRAM bitcells that only have one MTJ (e.g., as shown in FIGS. 1 and 2) typically have a storage capacity that is not large enough to complete with existing memory solutions such as static or dynamic RAM. As such, Multi-Level Memory Cells (MLCs) that include multiple MTJ structures have been proposed to provide greater memory density in circuits, applications, or other systems that employ MRAM. For example, FIG. 3 illustrates an exemplary prior art Multi-Level Memory Cell (MLC) 34 using multiple MTJ structures, which are represented in FIG. 3 as series-stacked $MTJ_1$ 33a and $MTJ_2$ 33b. By having $MTJ_1$ 33a and $MTJ_2$ 33b stacked in series, as shown in circuit diagram 36, the MLC 34 can be configured to have four different resistance states by combining the possible magnetic orientations associated with each of MTJ$_1$ 33a and MTJ$_2$ 33b. In particular, MTJ$_1$ 33a and MTJ$_2$ 33b can each have a parallel (P) or anti-parallel (AP) state, such that the MLC 34 can combine the possible P or AP states associated with each of MTJ$_1$ 33a and MTJ$_2$ 33b to achieve four possible states.

For example, as shown in circuit diagram 38, the four possible states may include a logical '00' (i.e., when MTJ$_1$ 33a and MTJ$_2$ 33b both have the P state), a logical '10' (i.e., when MTJ$_1$ 33a has the AP state and MTJ$_2$ 33b has the P state), a logical '01' (i.e., when MTJ$_1$ 33a has the P state and MTJ$_2$ 33b has the AP state), and a logical '11' (i.e., when MTJ$_1$ 33a and MTJ$_2$ 33b both have the AP state). However, in order to achieve the four possible states, the series stacked MTJ$_1$ 33a and MTJ$_2$ 33b must have different threshold currents and resistance variations in order to allow separate switching between MTJ$_1$ 33a and MTJ$_2$ 33b. To achieve this objective, the prior art MLC 34 shown in FIG. 3 includes a design whereby MTJ$_1$ 33a has an area half that of MTJ$_2$ 33b, and consequently, the resistance in MTJ$_1$ 33a will be half that of MTJ$_2$ 33b and the current flowing through MTJ$_1$ 33a will be double that flowing through MTJ$_2$ 33b. However, this design suffers from various drawbacks and disadvantages, including that one of the most significant factors determining the cost of a memory system is the manufacturing process, with more mask processes contributing to increased overall manufacturing costs. As such, the MLC 34 shown in FIG. 3 may substantially increase manufacturing costs because different masks would be required to fabricate MTJ$_1$ 33a and MTJ$_2$ 33b due to their different areas. Accordingly, because processing cost is a serious consideration in implementing features in an integrated circuit device, a need exists for an improvement in MRAM design and process flows, as eliminating the need for even one mask and associated processes can save significant fabrication costs.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any aspect. Its sole purpose is to present some concepts of one or more aspects in a simplified form as a prelude to the more detailed description that is presented below.

Exemplary embodiments are directed to a Multi-Level Memory Cell (MLC) that includes multiple Magnetic Tunnel Junction (MTJ) structures having one or more layers with varying thickness. According to one embodiment, the MLC using the multiple MTJ structures, which may be serially connected and arranged within a vertical stack, may be employed in a Magnetic Random Access Memory (MRAM) bitcell to provide magnetic data storage. In one embodiment, arranging the multiple MTJ structures in the vertical stack may reduce the area that the multiple MTJ structures occupy in the MLC, which may reduce die costs, increase memory density, and enable write operations to be performed using low amounts of voltage that are typically available in embedded applications without requiring any pump or boost circuits. The multiple MTJ structures may each include a respective pinned layer, a respective tunnel barrier, and a respective free layer. In one embodiment, the pinned layers, tunnel barriers, and free layers associated with the multiple MTJ structures may have substantially identical area dimensions (e.g., length and width dimensions), but the tunnel barriers and/or the free layers associated with the multiple MTJ structures may have varying thicknesses to ensure that the multiple MTJ structures having different switching current densities (e.g., the current needed to switch the MTJ structures to parallel and anti-parallel states). Accordingly, varying the thicknesses associated with the tunnel barriers and/or the free layers may minimize a cost to fabricate the MLC because a single mask can be used to pattern all of the multiple MTJ structures, with mask costs tending to be one of the most substantial factors in determining memory manufacturing or fabrication costs.

According to one embodiment, a method for forming the MLC or another suitable multi-level memory device may comprise, among other things, providing a conductive layer to flow current through a first MTJ element and a second MTJ element, which may be arranged in a serial configuration. The first MTJ element and the second MTJ element may be patterned using a single mask (i.e., the same mask can be used to pattern both MTJ elements), wherein the first MTJ element may be patterned between a first metal layer and a second metal layer and the second MTJ element may be patterned between the second metal layer and a third metal layer. The first MTJ element and the second MTJ element may be fabricated such that a first barrier layer of the first MTJ element and a second barrier layer of the second MTJ element have different thicknesses. In one embodiment, the thicknesses of the first barrier layer and the second barrier layer may be adjusted such that the first barrier layer has a resistance approximately two times a resistance of the second barrier layer (or vice versa, depending on which barrier layer is thicker) when the first MTJ element and the second MTJ element have a symmetric state (e.g., when the first MTJ element and the second MTJ element both have a parallel magnetic orientation or when the first MTJ element and the second MTJ element both have an anti-parallel magnetic orientation). In one embodiment, the first MTJ element and the second MTJ element may be fabricated such that the barrier layers of the first MTJ element and the second MTJ element have substantially identical area dimensions. Furthermore, a first free layer of the first MTJ element and a second free layer of the second MTJ element may have substantially identical area dimensions, and moreover may have different thicknesses and/or be formed from different materials. In certain embodiments, the first and second MTJ elements may have respective film stacks in which the barrier layers associated therewith are disposed above the pinned layers and below the free layers, or alternatively in which the barrier layers are disposed below the pinned layer and above the free layer, or any suitable combination thereof.

According to one embodiment, an MLC or multi-level memory device may comprise a first MTJ element disposed between a first metal layer and a second metal layer and a second MTJ element disposed between the second metal layer and a third metal layer, wherein the first MTJ element comprises a first barrier layer having a first thickness and the second MTJ element comprises a second barrier layer having a second thickness that is different from the first thickness of the first barrier layer. In one embodiment, the second metal layer may be formed from multiple electrically interconnected metal layers and the respective barrier layers associated with the first and second MTJ elements may be formed from magnesium oxide (MgO). Furthermore, the respective barrier layers associated with the first and second MTJ elements may have substantially identical area dimensions, whereby the different thicknesses of the first barrier layer and the second barrier layer may cause the first barrier layer to have a resistance approximately two times a resistance of the second barrier layer (or vice versa, depending on which barrier layer is thicker) when the first MTJ element and the second MTJ element have a symmetric state. In one embodiment, a first free layer of the first MTJ element and a second free layer of the second MTJ element may further have substantially identical area dimensions but different thicknesses and/or be formed from different materials. In one embodiment, the first MTJ element and the second MTJ element may have respective film stacks with identical configurations in which the barrier layers associated therewith are disposed above the pinned layers and below the free layers. In one embodiment, the film stack associated with the first MTJ element and/or the second MTJ element may be reversed such that the barrier layer is disposed below the pinned layer and above the free layer.

According to one embodiment, an apparatus for forming the MLC or another suitable multi-level memory device may comprise means for providing a conductive layer to flow current through a first MTJ element and a second MTJ element, which may be arranged in a serial configuration. In addition, the apparatus may comprise means for using a single mask to pattern the first MTJ element and the second MTJ element and means for fabricating the first MTJ element and the second MTJ element such that a first barrier layer of the first MTJ element and a second barrier layer of the second MTJ element have different thicknesses. In one embodiment, the apparatus may further comprise means for adjusting the thicknesses of the first barrier layer and the second barrier layer such that the first barrier layer has a resistance approximately two times a resistance of the second barrier layer (or vice versa, depending on which barrier layer is thicker) when the first MTJ element and the second MTJ element have an identical or otherwise symmetric state. In one embodiment, the fabricating means may be further configured to fabricate the first MTJ element and the second MTJ element such that the barrier layers and free layers of the first MTJ element and the second MTJ element have substantially identical area dimensions. In one embodiment, however, the first free layer and the second free layer may have different thicknesses and/or be formed from different materials. In one embodiment, the first MTJ element and the second MTJ element may be fabricated to have film stacks with identical configurations in which the barrier layers associated therewith are disposed above the pinned layers and below the free layers or in which the barrier layers associated therewith are disposed below the pinned layers and above the free layers. In another embodiment, the first MTJ element and/or the second MTJ element may have film stacks with different (e.g., reversed) configurations such that the barrier layer associated with one of the MTJ elements is disposed above the pinned layer and below the free layer and the barrier layer associated with the other MTJ element is disposed below the pinned layer and above the free layer.

According to one embodiment, a method for writing the multi-level memory device summarized in the embodiments described above may comprise determining a target state for the multi-level memory device and flowing one or more currents through the first MTJ element and the second MTJ element to establish the target state. For example, if the target state is a logical '00' where the first MTJ element and the second MTJ element both have a parallel (P) magnetic orientation or a logical '11' where the first MTJ element and the second MTJ element both have an anti-parallel (AP) magnetic orientation, the flowed currents may comprise a single current sufficient to switch the first MTJ element and the second MTJ element to the appropriate magnetic orientation, wherein a direction in which the single current flows through the first MTJ element and the second MTJ element may vary based on whether the target state is a logical '00' or a logical '11'. However, if the target state is a logical '01' where the first MTJ element and the second MTJ element respectively have P and AP magnetic orientations or a logical '10' where the first MTJ element and the second MTJ element respectively have AP and P magnetic orientations, the flowed currents may include two currents that are sequentially flowed in opposite directions. In particular, the two sequential currents may include a first current sufficient to switch both the first MTJ element and the second MTJ element to a symmetric magnetic orientation (either P or AP) and a second current that is smaller than the first current and sufficient to further switch only one of the first MTJ element or the second MTJ element without further switching the other MTJ element, thereby establishing the appropriate logical state. Further, the directions in which the sequential currents flow may vary based on whether the target state is a logical '01' or a logical '10'.

According to one embodiment, an alternate method may be used to write the multi-level memory device when a first film stack of the first MTJ element is reversed from a second film stack of the second MTJ element (i.e., where the pinned layers and free layers of the first MTJ element and the second MTJ element are disposed in the vertical stack differently relative to the barrier layers). In this case, if the target state is a logical '01' or a logical '10', the one or more currents flowed through the first MTJ element and the second MTJ element may comprise a first current sufficient to switch the first MTJ element and the second MTJ element to an asymmetric magnetic orientation (e.g., where one of the MTJ elements has a P magnetic orientation and the other has an AP magnetic orientation). However, if the target state is a logical '00' or a logical '11', an additional current may be flowed through the first MTJ element and the second MTJ element, wherein the additional current is smaller than the first current and sufficient to further switch one of the first MTJ element or the second MTJ element without further switching the other MTJ element.

According to one embodiment, an apparatus for writing the multi-level memory device may comprise means for determining a target state for the multi-level memory device and means for flowing one or more currents through the first MTJ element and the second MTJ element to establish the target state. For example, as noted above, the one or more currents may include a single current if the target state is a logical '00' or a logical '11', while the one or more currents may include a large current and a small current that are flowed sequentially if the target state is a logical 01 or a logical 10. Alternatively, if the first MTJ element and the second MTJ element have respective film stacks that are reversed from one another, the one or more currents may include a single current if the target state is a logical '01' or a logical '10', while the one or more currents may include a large current and a small current that are flowed sequentially if the target state is a logical '00' or a logical '11'.

According to one embodiment, a computer-readable storage medium may store computer-executable instructions for writing the multi-level memory device, wherein executing the computer-executable instructions on a processor causes the processor to determine a target state for the multi-level memory device and flow one or more currents through the first MTJ element and the second MTJ element to establish the target state. For example, in one embodiment, the one or more currents may include a single current if the target state is a logical '00' or a logical '11', or the one or more currents may include a large current and a small current that are flowed sequentially if the target state is a logical '01' or a logical '10'. In another embodiment where the first MTJ element and the second MTJ element have film stacks that are arranged in a reversed configuration relative to one another, the one or more currents may include a single current if the target state is a logical '01' or a logical '10', or the one or more currents may include a large current and a small current that are flowed sequentially if the target state is a logical '00' or a logical '11'.

Other objects and advantages associated with the embodiments disclosed herein relating to MLCs that use multiple MTJ elements with varying MgO thickness will be apparent to those skilled in the art based on the accompanying drawings and detailed description.

BRIEF DESCRIPTION OF THE DRAWINGS

The accompanying drawings are presented to aid in the description of exemplary embodiments and are provided solely for illustration of the embodiments and not limitation thereof.

DETAILED DESCRIPTION

Figure 1:
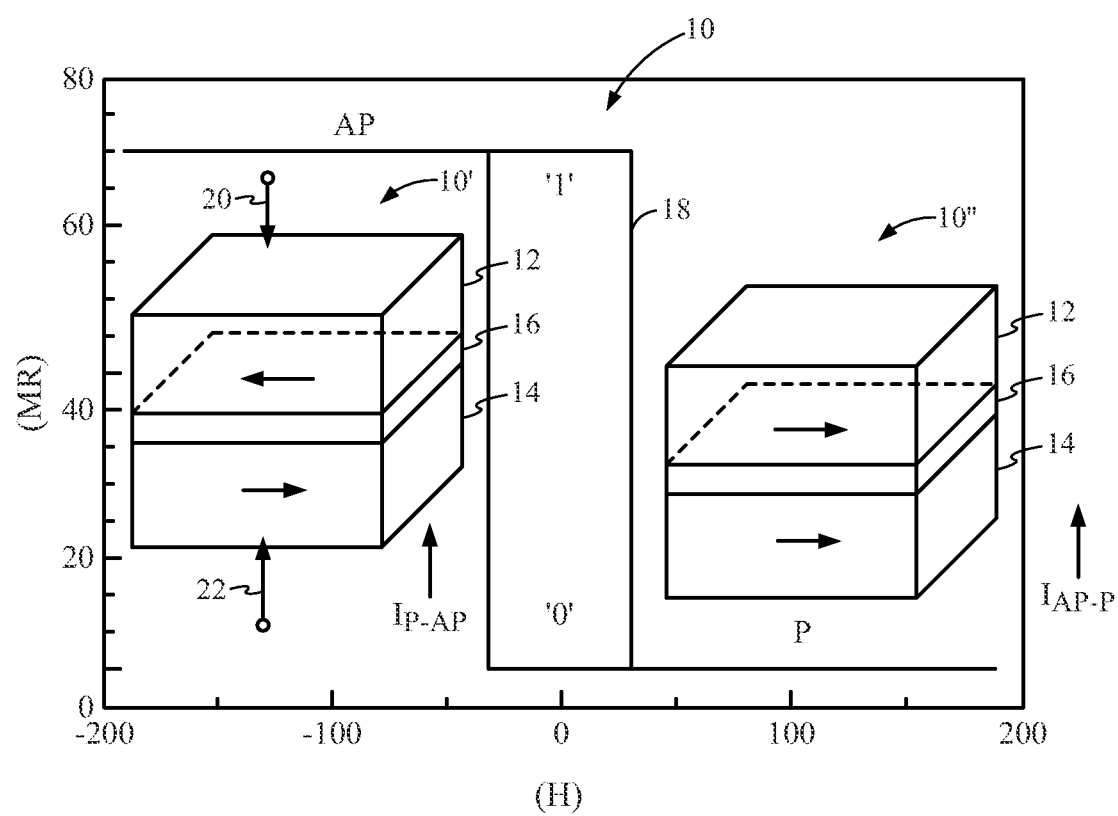
FIG. 1 illustrates an exemplary prior art Magnetic Tunnel Junction (MTJ) structure in both parallel (P) and anti-parallel (AP) states.
Figure 2:
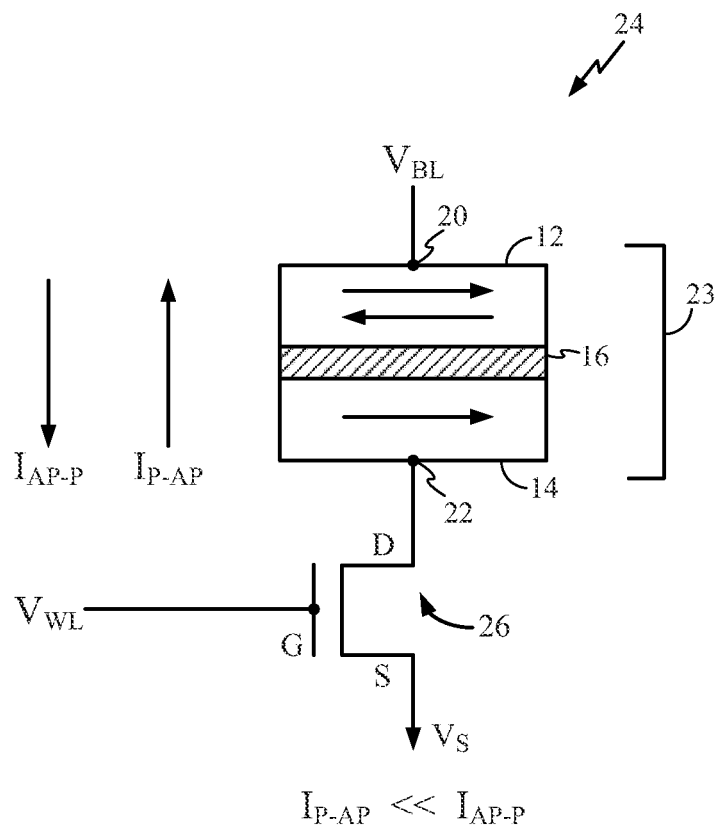
FIG. 2 illustrates an exemplary prior art Magnetic Random Access Memory (MRAM) bitcell employing a conventional MTJ design.
Figure 3:
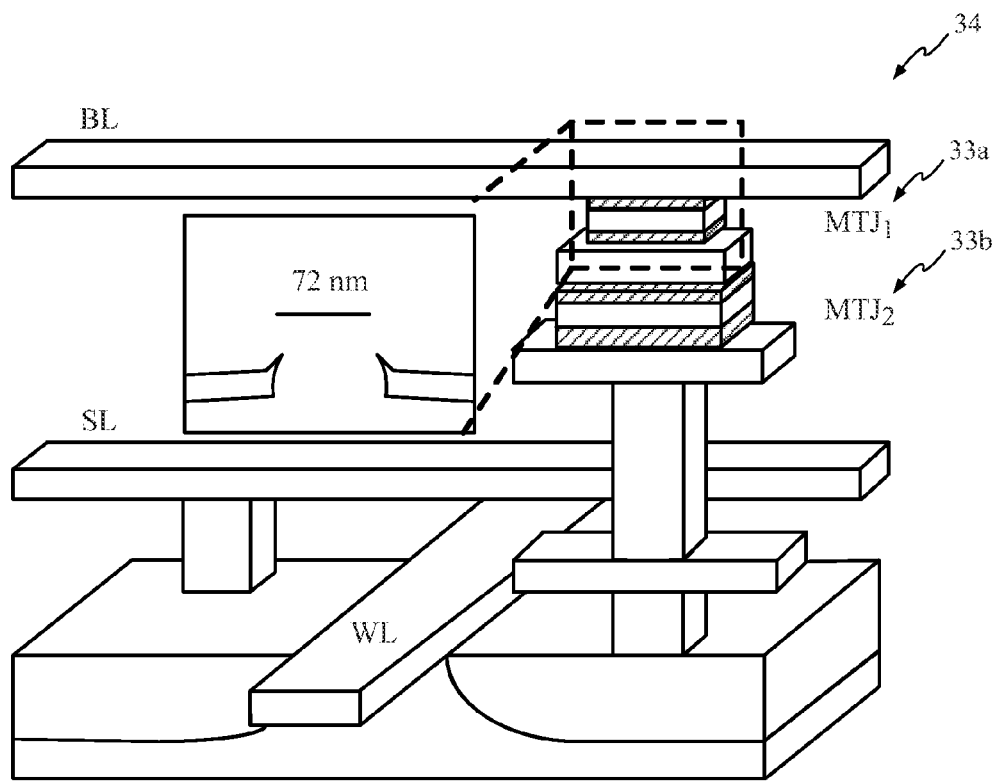
FIG. 3 illustrates an exemplary prior art Multi-Level Memory Cell (MLC) using multiple MTJ structures that have different areas.
Figure 3:
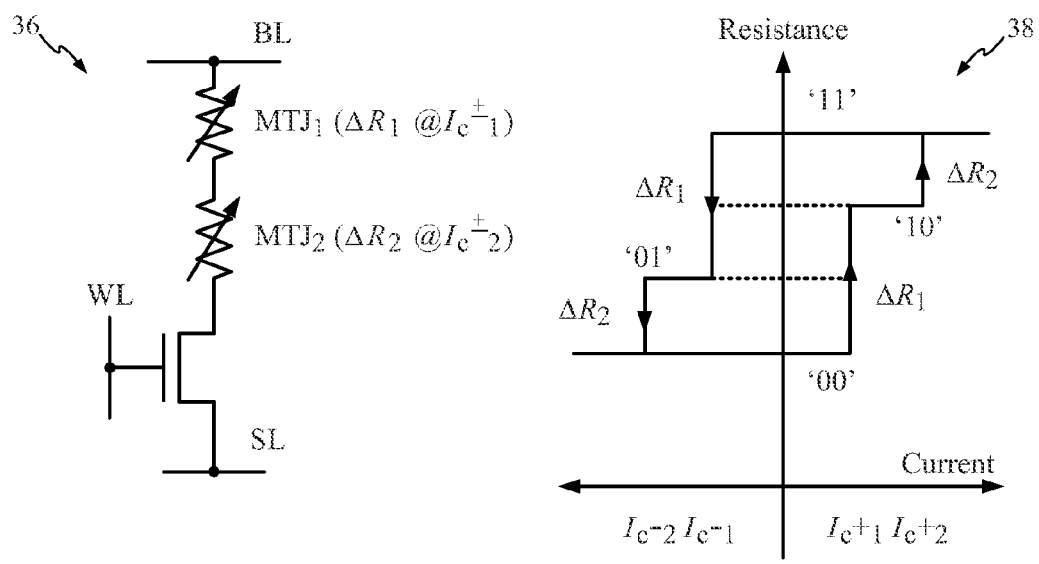

Aspects disclosed in the following description and related drawings show specific examples corresponding to various exemplary embodiments of a Multi-Level Memory Cell (MLC) using multiple Magnetic Tunnel Junction (MTJ) structures having one or more layers with varying thicknesses. Alternate embodiments may be apparent those skilled in the pertinent art upon reading this disclosure, and may be constructed and practiced without departing from the scope or spirit of the exemplary aspects and embodiments disclosed herein. Additionally, well-known elements will not be described in detail or will be omitted so as not to obscure the relevant details of the exemplary aspects and embodiments disclosed herein.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is provided to describe particular embodiments only and is not intended to limit any of the exemplary aspects or embodiments disclosed herein. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

The terms "Multi-Level Memory Cell" (MLC) and "Magnetic Tunnel Junction" (MTJ) used herein can mean one or more storage elements, registers, or the like, or represent one or more structures implemented via computer-executable instructions that operate on one or more processors, controllers, or the like. The MLC and associated MTJ structures can be incorporated into one or more Magnetic Random Access Memory (MRAM) bitcells, which may operate with logic circuitry such as microprocessors or be integrated into devices that employ the microprocessors. For example, the MRAM bitcells may be part of a communications device. Of course, the MRAM bitcells may include or be used with other types of circuitry without departing from the scope and spirit of the disclosure. Further, MRAM bitcells incorporating the multiple MTJ structures are Spin-Transfer Torque (STT) MRAM bitcells, the MLC associated therewith may be scalable to smaller dimensions and provide compatibility with nano-scale fabrication to fabricate STT MRAM memory chips at lower costs and with higher device density. Accordingly, as used herein, the terms "MRAM" or "MRAM bitcells" may refer to STT MRAM, STT MRAM bitcells, or any other suitable memory device that may employ the MLC design that uses multiple MTJ structures in accordance with the disclosed embodiments.

Figure 4:
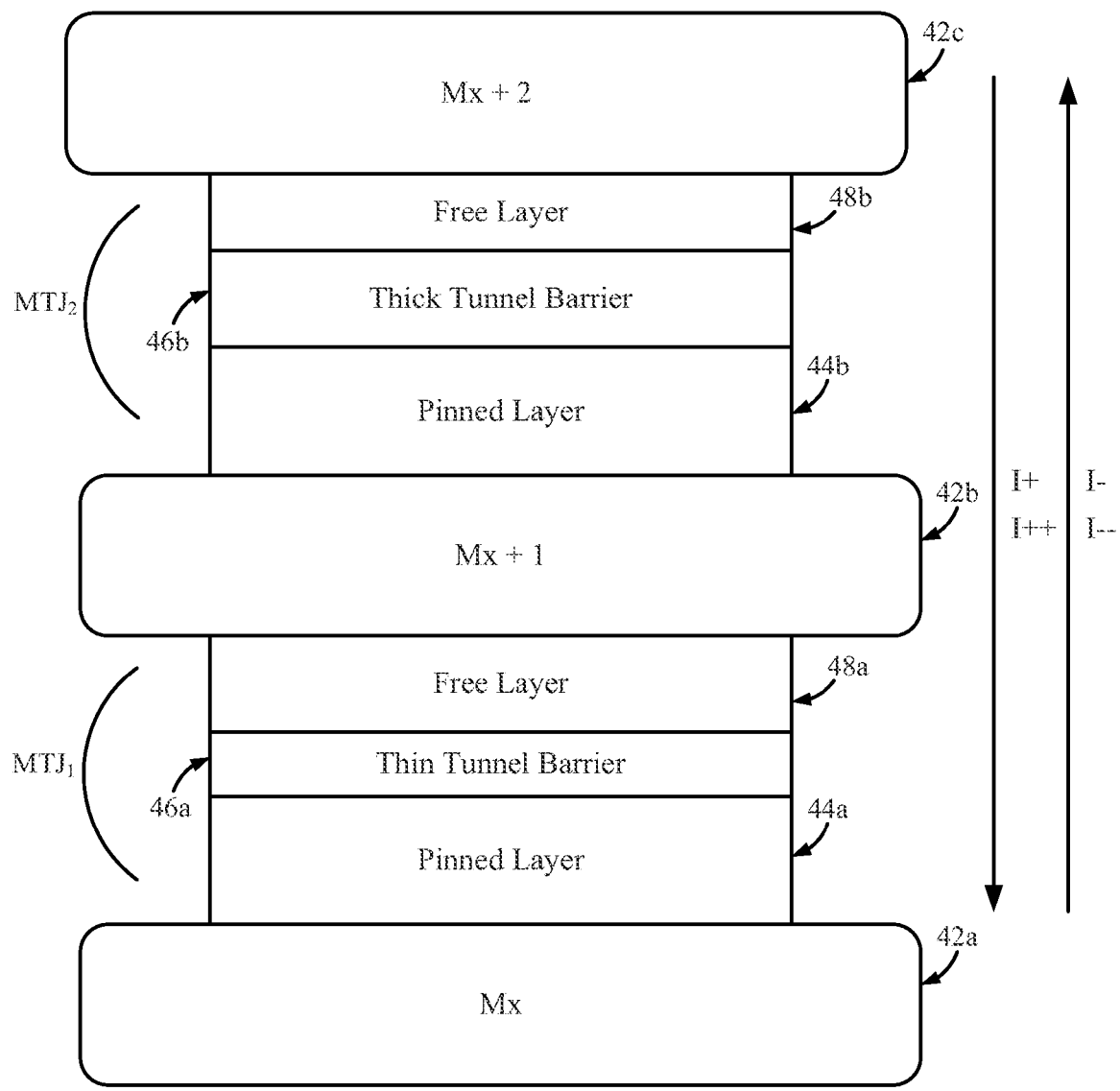
FIG. 4 illustrates an exemplary MLC using multiple MTJ structures having one or more layers with varying thickness, according to one exemplary embodiment.

According to one exemplary embodiment, FIG. 4 illustrates an exemplary MLC using multiple MTJ structures that have one or more layers with varying thickness, wherein the multiple MTJ structures may be represented via reference characters $MTJ_1$ and $MTJ_2$ shown in FIG. 4. In one embodiment, the MLC using the multiple MTJ structures (e.g., MTJ structures $MTJ_1$ and $MTJ_2$) may be employed in a suitable MRAM bitcell to provide magnetic data storage, where the MLC may comprise an access transistor (not shown) that controls reading and writing to the MLC. The MLC may further arrange the $MTJ_1$ and $MTJ_2$ structures in a vertical stack, wherein $MTJ_1$ and $MTJ_2$ structures include respective pinned layers 44a-b, tunnel barriers 46a-b, and free layers 48a-b, which may be collectively referred to herein as pinned layers 44, tunnel barriers 46, and free layers 48. One or more inter-level dielectric layers 42a-b may separate $MTJ_1$ from $MTJ_2$ and provide a series connection among the vertically stacked $MTJ_1$ and $MTJ_2$. As shown in FIG. 4, the vertically stacked $MTJ_1$ and $MTJ_2$ may each arrange their respective free layers 48a-b between their respective tunnel barriers 46a-b and upper inter-level dielectric layers 42b-c, such that the respective free layers 48a-b are disposed above the respective pinned layers 44a-b. In one embodiment, the pinned layer 44a may be coupled to a bottom electrode of the MLC (e.g., inter-level dielectric layer 42a), which may be coupled to a drain of the access transistor. A word line ($V_{WL}$) may be coupled to a gate of the access transistor and a voltage source ($V_S$) may be coupled to a source of the access transistor. The free layer 48b may be coupled to a top electrode of the MLC (e.g., inter-level dielectric layer 42c), which may be coupled to a bit line ($V_{BL}$). In one embodiment, inter-level dielectric layer 42c may alternatively separate $MTJ_2$ from one or more additional MTJ structures (not shown) that may be vertically stacked above inter-level dielectric layer 42c and arranged in series with $MTJ_1$ and $MTJ_2$. As such, arranging the $MTJ_1$ and $MTJ_2$ structures (and/or additional MTJ structures) in the vertical stack may reduce the area that the $MTJ_1$ and $MTJ_2$ structures (and/or the additional MTJ structures)

occupy in the MLC, which may reduce die costs while increasing memory density. Furthermore, write operations can be performed using relatively low voltage (e.g., that available in typical embedded applications without requiring any pump or boost circuits).

In one embodiment, as shown in FIG. 4, the pinned layers 44a-b, tunnel barriers 46a-b, and free layers 48a-b associated with both of $MTJ_1$ and $MTJ_2$ may have substantially identical length and width dimensions such that $MTJ_1$ and $MTJ_2$ have substantially identical areas. However, to ensure that different switching currents can be used to switch $MTJ_1$ and $MTJ_2$ between parallel (P) and anti-parallel (AP) states and thereby enable the MLC to have four possible states, tunnel barrier 46a and tunnel barrier 46b may have different thicknesses. For example, as shown in FIG. 4, tunnel barrier 46a may be thinner than tunnel barrier 46b, which may cause the thin tunnel barrier 46a to have a smaller resistance (more current flow) and the thick tunnel barrier 46b to have a larger resistance (less current flow). In this manner, the MLC shown in FIG. 4 may have minimal mask costs because the same mask can be used to pattern $MTJ_1$ and $MTJ_2$. Furthermore, in one embodiment, the thickness associated with the free layer 48a and free layer 48b may be varied to adjust the intrinsic switching density ($J_C$) associated with $MTJ_1$ and $MTJ_2$ and thereby tune the write margins to cause the MLC to reach the four possible states. In one embodiment, an optional capping layer may be inserted into $MTJ_1$ and/or $MTJ_2$ and the thickness associated therewith may be improved to tune the write margins to reach each possible state.

In one embodiment, to form $MTJ_1$, a stack of layers may be placed or otherwise deposited on the first inter-level dielectric layer 42a via sputtering, ion beam deposition, or another suitable fabrication mechanism, wherein the stack of layers may include pinned layer 44a, tunnel barrier 46a, and free layer 48a. For example, in one embodiment, the pinned layer 44a may include one or more anti-ferromagnetic layers placed or deposited on top of the first inter-level dielectric layer 42a to hold or "pin" a magnetic moment of the pinned layer 44a in a fixed direction, wherein the anti-ferromagnetic layers may be formed from any suitable anti-ferromagnetic material, with examples including Platinum-Manganese (PtMn) and Iridium-Manganese (IrMn). In addition, the pinned layer 44a may include one or more ferromagnetic layers, which may be formed from alloys that include iron, or the pinned layer 44a may comprise a single pinned ferromagnetic layer formed from any suitable ferromagnetic material. In each case, the pinned layer 44a may have a predefined thickness.

Next, a thin dielectric material may be placed or deposited on the pinned layer 44a to form the tunnel barrier 46a, which may be formed from any suitable dielectric material, with examples including Magnesium Oxide (MgO), Aluminum Oxides ($AlO_X$), and Titanium Oxides ($TiO_X$). The free layer 48a may then be placed or deposited on the tunnel barrier 46a and below a second inter-level dielectric layer 42b, wherein the free layer 48a may be formed from any suitable ferromagnetic material, with examples including Cobalt-Iron-Boron (CoFeB), Cobalt-Iron (CoFe), and Nickel-Iron (NiFe). The free layer 48a may also comprise composite ferromagnetic layers. As noted above, the thickness associated with the tunnel barrier 46a and free layer 48a may be varied to adjust the intrinsic switching density ($J_C$) associated with $MTJ_1$. Accordingly, the oxidation time associated with the sputtering, ion beam deposition, or other fabrication mechanism used to place or deposit the tunnel barrier 46a and free layer 48a may be varied, which may allow the thicknesses associated with the tunnel barrier 46a and free layer 48a to be controlled to within approximately one Angstrom or less. Furthermore, as noted above, a capping layer may optionally be inserted into the $MTJ_1$, in which case the capping layer may be formed and the thickness thereof controlled in a substantially similar to that described above with respective to the tunnel barrier 46a and free layer 48a.

In one embodiment, $MTJ_2$ may be formed in a substantially similar manner to that described above with respect to $MTJ_1$ and therefore many details associated with forming the $MTJ_2$ will not be repeated for purposes of brevity. However, the process used to form $MTJ_2$ may vary somewhat in terms of the thickness associated with tunnel barrier 46b and free layer 48b (and/or any optional capping layer that may be inserted therein). For example, as shown in FIG. 4, the tunnel barrier 46b associated with $MTJ_2$ has a greater thickness than the tunnel barrier 46a associated with $MTJ_1$, wherein longer oxidation times may result in thicker layers and shorter oxidation times may result in thinner layers. As such, in one embodiment, the oxidation times to place or otherwise deposit the tunnel barrier 46b and free layer 48b (and/or the optional capping layer if inserted therein) may be suitably varied to adjust the thickness associated with the tunnel barrier 46b and free layer 48b (and/or the optional capping layer). Furthermore, in one embodiment, the various inter-level dielectric layers 42a-c (collectively referred to as inter-level dielectric layers 42) may have a smaller, identical, or larger area than the $MTJ_1$ and $MTJ_2$ structures. However, when using the MLC in an embedded system or other device that has small dimensions, challenges that relate to aligning the inter-level dielectric layers 42 with the $MTJ_1$ and $MTJ_2$ structures that are patterned using the single mask may rendered substantially moot if the inter-level dielectric layers 42 have a larger area than the $MTJ_1$ and $MTJ_2$ structures.

In one embodiment, the free layer 48a has a magnetic moment that is either P or AP to the magnetic moment of the pinned layer 44a, and the free layer 48b similarly has a magnetic moment that is either P or AP to the magnetic moment of the pinned layer 44b. In particular, the magnetic moments of the free layers 48a and 48b may change in response to external magnetic fields and the relative orientation of the magnetic moments between the free layers 48a-b and the pinned layers 44a-b determine the tunneling current and therefore the resistance of the respective tunnel barriers 46a and 46b. When reading the data stored in the MLC shown in FIG. 4, the bit line ($V_{BL}$) is activated to allow current to flow through the MLC, where low resistances and high resistances in $MTJ_1$ and $MTJ_2$, as measured by voltage applied on the bit line ($V_{BL}$) divided by the measured current, are respectively associated with a P orientation and an AP orientation. Accordingly, $MTJ_1$ and $MTJ_2$ each have two possible states (either P or AP) and the MLC consequently has four possible states depending on the particular combination of states associated with $MTJ_1$ and $MTJ_2$.

For example, a difference in tunneling current to switch $MTJ_1$ between the P state and the AP state may define a first Tunnel Magnetoresistance Ratio ($TMR_1$), while a difference in the tunneling current to switch $MTJ_2$ between the P state and the AP state may define a second Tunnel Magnetoresistance Ratio ($TMR_2$). As such, $MTJ_1$ may have a first resistance value represented by the variable $R_{P1}$ when the free layer 48a in $MTJ_1$ has a magnetic moment that is P to the magnetic moment of the pinned layer 44a therein, whereas $MTJ_1$ may have a second resistance value given by $R_{P1}*(1+TMR_1)$ when the magnetic moment associated with the free layer 48a in $MTJ_1$ is AP to the magnetic moment of the pinned layer 44a in $MTJ_1$. Similarly, $MTJ_2$ may have a first resistance value represented by the variable $R_{P2}$ when the free layer 48b in MTJ$_2$ has a magnetic moment that is P to the magnetic moment of the pinned layer 44b therein, while MTJ$_2$ may have a second resistance value given by R$_{P2}$*(1+TMR$_2$) when the magnetic moment associated with the free layer 48b in MTJ$_2$ is AP to the magnetic moment of the pinned layer 44b in MTJ$_2$.

Furthermore, the tunnel barrier 46b in MTJ$_2$ has a greater thickness than the tunnel barrier 46a in MTJ$_1$ such that R$_{P2}$=k*R$_{P1}$, where k is a constant to scale the resistance of tunnel barrier 46b relative to tunnel barrier 46a. In one embodiment, a value may be chosen for the constant k to ensure that separations between the resistances associated with four possible states for the MLC are identical, such that TMR$_1$ and TMR$_2$ are approximately equal and each can simply be represented as TMR. In one embodiment, the separations between the resistances associated with four possible states for the MLC will be identical when k=2, as shown in the following table, which assumes that R$_{P1}$=2.5 kOhm and TMR=1 (i.e., 100%):

| Logical State | MTJ$_1$ State | MTJ$_2$ State | Resistance Formula | Resistance Value |
|---|---|---|---|---|
| '00' | P | P | R$_{P1}$ * (1 + k) | 7.5 kOhm |
| '01' | P | AP | R$_{P1}$ * (1 + TMR + k) | 10.0 kOhm |
| '10' | AP | P | R$_{P1}$ * (1 + k * TMR + k) | 12.5 kOhm |
| '11' | AP | AP | R$_{P1}$ * (1 + TMR) * (1 + k) | 15.0 kOhm |

Accordingly, when k=2, the separations between the resistances associated with four possible states for the MLC will be R$_{P1}$*TMR, whereby the separation between each state becomes 2.5 kOhm when R$_{P1}$=2.5 kOhm and TMR=100%. As such, the data stored in the MLC may be read by activating the bit line (V$_{BL}$) to allow current to flow through the MLC and then dividing the voltage applied on the bit line (V$_{BL}$) by the current flowing through the MLC to measure the combined resistance of MTJ$_1$ and MTJ$_2$, which may indicate the logical state associated with the MLC.

When writing data to the MLC, the existing logical state associated therewith may first be determined, wherein a write operation may be unnecessary if the existing logical state matches a target logical state associated with the write operation. On the other hand, if the existing logical state associated with the MLC does not match the target logical state, one or more write operations may be performed to change the magnetic orientation associated with MTJ$_1$ and/or MTJ$_2$. In particular, to change the magnetic orientation associated with MTJ$_1$ and/or MTJ$_2$ and thereby store new data in the MLC, a voltage may be applied on the word line (V$_{WL}$) to activate the gate of the access transistor and generate a write current between the drain and the source of the access transistor. In one embodiment, a current may then flow either from the top electrode to the bottom electrode of the MLC (e.g., from inter-level dielectric layer 42c to inter-level dielectric layer 42a) or from the bottom electrode to the top electrode of the MLC (e.g., from inter-level dielectric layer 42a to inter-level dielectric layer 42c). In either case, the same current may flow through MTJ$_1$ and MTJ$_2$ due to the serial connection associated therewith. As such, in one embodiment, the particular current produced in the one or more write operations may depend on the target logical state.

For example, as noted above, the tunnel barrier 46b in MTJ$_2$ may have a greater thickness than the tunnel barrier 46a in MTJ$_1$, whereby MTJ$_1$ may have a smaller switching current density than MTJ$_2$. As such, in one embodiment, the thickness associated with free layers 48a and 48b (and/or any optional capping layers) may be tuned to ensure that MTJ$_2$ has a sufficiently smaller switching current density than MTJ$_1$ such that MTJ$_2$ can be switched between P and AP states more easily than MTJ$_1$, wherein the simplest way to secure these write margins may be to increase the thickness of the free layer 48a in MTJ$_1$. Alternatively (or additionally), the free layer 48a in MTJ$_1$ and the free layer 48b in MTJ$_2$ may be formed from different materials to suitably control the switching current density associated with MTJ$_1$ and MTJ$_2$ such that MTJ$_2$ switches between states more easily than MTJ$_1$. Accordingly, due to the smaller switching current density associated with MTJ$_2$, which may be achieved by adjusting the thicknesses or materials of free layers 48a and 48b (and/or any optional capping layers), smaller currents flowing through the MLC in either direction will only switch MTJ$_2$ without switching MTJ$_1$, while larger currents flowing through the MLC in either direction will switch both MTJ$_1$ and MTJ$_2$. In particular, a large current I$^{++}$ flowing from the top electrode to the bottom electrode of the MLC may switch both MTJ$_1$ and MTJ$_2$ to P (or logical state '00'), while a large current I$^{--}$ flowing from the bottom electrode to the top electrode of the MLC may switch both MTJ$_1$ and MTJ$_2$ to AP (or logical state '11').

However, to establish an asymmetric state (logical state '01' or '10'), two write cycles may be performed. In particular, to switch MTJ$_1$ to P and MTJ$_2$ to AP (or logical state '01'), the large current I$^{++}$ flowing from the top electrode to the bottom electrode may first be produced to switch both MTJ$_1$ and MTJ$_2$ to P (or logical state '00') and a small current I$^{--}$ flowing from the bottom electrode to the top electrode may then be produced to switch MTJ$_2$ to AP without further switching MTJ$_1$, thereby establishing logical state '01'. Similarly, to switch MTJ$_1$ to AP and MTJ$_2$ to P (or logical state '10'), the large current I$^{--}$ flowing from the bottom electrode to the top electrode may first be produced to switch both MTJ$_1$ and MTJ$_2$ to AP (or logical state '11') and a small current I$^{+}$ flowing from the top electrode to the bottom electrode may then be produced to switch MTJ$_2$ to P without further switching MTJ$_1$, thereby establishing logical state '10'. Accordingly, the current produced in the one or more write operations to achieve the target logical state is as shown in the following table:

| Target State | MTJ$_1$ State | MTJ$_2$ State | Write Operation 1 | Write Operation 2 |
|---|---|---|---|---|
| '00' | P | P | I$^{++}$ | None |
| '01' | P | AP | I$^{++}$ | I$^{-}$ |
| '11' | AP | P | I$^{--}$ | I$^{+}$ |
| '11' | AP | AP | I$^{--}$ | None |

Figure 5:
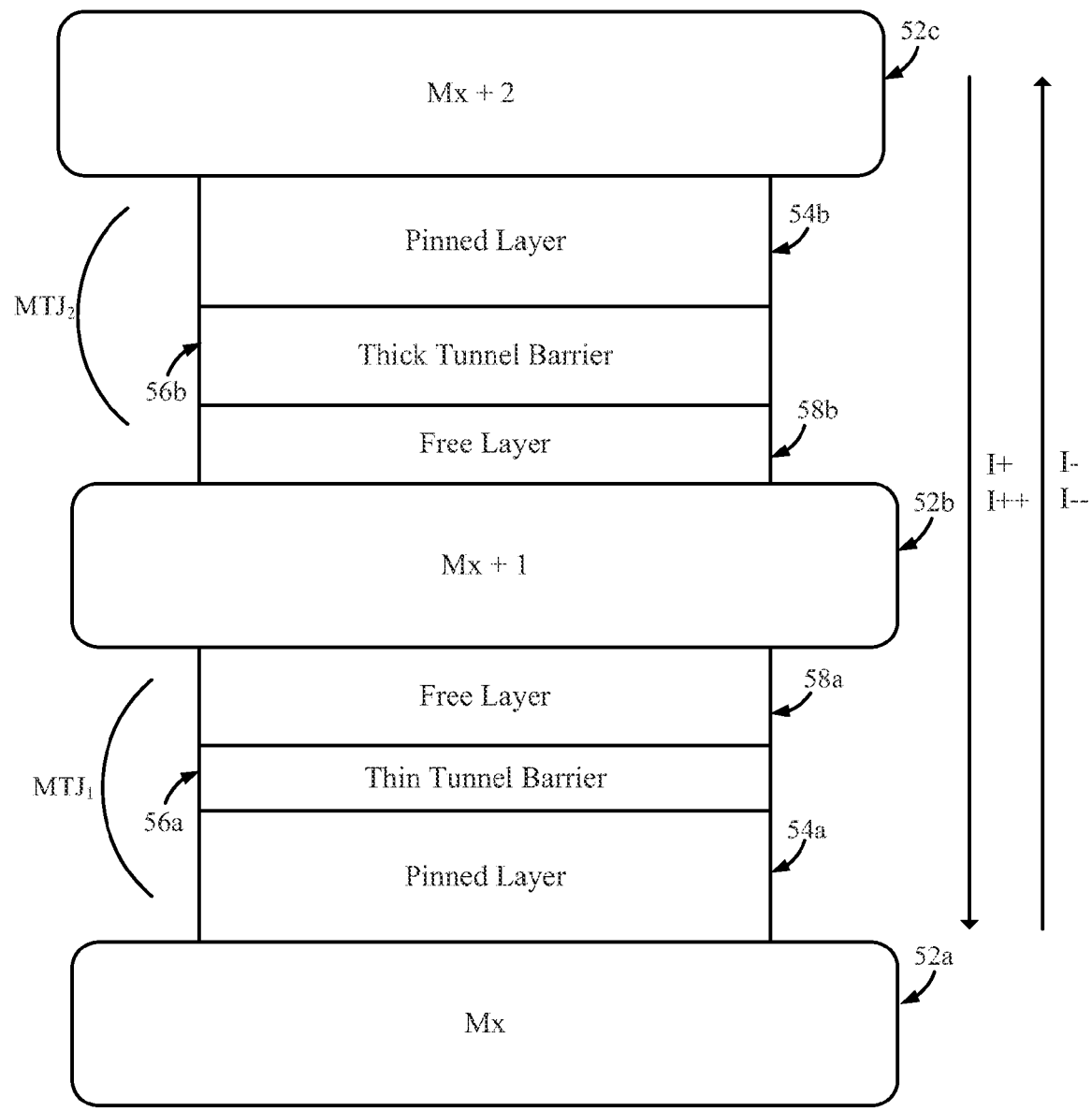
FIG. 5 illustrates another exemplary MLC using multiple MTJ structures having one or more layers with varying thickness, according to one exemplary embodiment.

According to one exemplary embodiment, FIG. 5 illustrates another exemplary MLC using multiple MTJ structures that have one or more layers with varying thickness. In one embodiment, the MLC shown in FIG. 5 may have substantially similar characteristics and properties to that described above with respect to the MLC shown in FIG. 4 and described above, and therefore many details associated with the MLC shown in FIG. 5 will not be repeated for purposes of brevity. For example, the MLC shown in FIG. 5 may include various inter-level dielectric layers 52a-c that are arranged and have substantially similar characteristics to the inter-level dielectric layers 42a-c shown in FIG. 4 and described in further detail above, and furthermore, MTJ$_1$ in the MLC shown in FIG. 5 may include a film stack having a pinned layer 54a, tunnel barrier layer 56a, and free layer 58a that are arranged and have substantially similar characteristics to the pinned layer 44a, tunnel barrier layer 46a, and free layer 48a associated with MTJ₁ as shown in FIG. 4 and described in further detail above. However, it will be noted that the MLC shown in FIG. 5 differs from the MLC shown in FIG. 4 in that the film stack associated with MTJ₂ has been reversed such that pinned layer 54b is disposed above tunnel barrier 56b and free layer 58b is disposed below tunnel barrier 56b, whereas the MLC shown in FIG. 4 has pinned layer 44b disposed below tunnel barrier 46b and free layer 48b disposed above tunnel barrier 46b. Accordingly, another difference between the MLC shown in FIG. 5 relative to the MLC shown in FIG. 4 may relate to appropriately reversing the fabrication processes used to place or otherwise deposit pinned layer 54b and free layer 58b.

Furthermore, reversing the film stack associated with MTJ₂ such that pinned layer 54b is disposed above tunnel barrier 56b and free layer 58b is disposed below tunnel barrier 56b may change the manner in which write operations are performed to program the MLC into the target logical state, which may be advantageous in certain situations where asymmetry between MTJ₁ and MTJ₂ has a substantial affect on write margins or where greater write margins are otherwise required. However, it will be further noted that reversing the film stack associated with MTJ₂ does not impact or otherwise change the manner in which data is read from the MLC, which may be carried out in substantially the same manner as that described above with respect to the MLC shown in FIG. 4.

In one embodiment, data may be written to the MLC shown in FIG. 5 in a generally similar manner to that described above with respect to the MLC shown in FIG. 4, except that due to the reversed film stack associated with MTJ₂, larger currents flowing through the MLC in either direction will switch MTJ₁ and MTJ₂ into an asymmetric state (i.e., logical state '01' or '10'). In particular, a large current $I^{++}$ flowing from the top electrode to the bottom electrode of the MLC may be produced to switch MTJ₁ to P and MTJ₂ to AP (or logical state '01'), while a large current $I^{--}$ flowing from the bottom electrode to the top electrode of the MLC may be produced to switch MTJ₁ to AP and MTJ₂ to P (or logical state '10'). However, to establish a symmetric state (i.e., logical state '00' or '11'), two write cycles may be performed. In particular, to switch both MTJ₁ and MTJ₂ to P (or logical state '00'), the large current $I^{++}$ flowing from the top electrode to the bottom electrode may first be produced to switch MTJ₁ to P and MTJ₂ to AP (or logical state '01') and a small current $I^-$ flowing from the bottom electrode to the top electrode may then be produced to switch MTJ₂ to P without further switching MTJ₁, thereby establishing logical state '00'. Similarly, to switch both MTJ₁ and MTJ₂ to AP (or logical state '11'), the large current $I^{--}$ flowing from the bottom electrode to the top electrode may first be produced to switch MTJ₁ to AP and MTJ₂ to P (or logical state '10') and a small current $I^+$ flowing from the top electrode to the bottom electrode may then be produced to switch MTJ₂ to AP without further switching MTJ₁, thereby establishing logical state '11'. Accordingly, the following table shows the current produced in the one or more write operations to achieve the target logical state in the MLC shown in FIG. 5:

| Target State | MTJ₁ State | MTJ₂ State | Write Operation 1 | Write Operation 2 |
|---|---|---|---|---|
| '00' | P | P | $I^{++}$ | $I^-$ |
| '01' | P | AP | $I^{++}$ | None |
| '10' | AP | P | $I^{--}$ | None |
| '11' | AP | AP | $I^{--}$ | $I^+$ |

Moreover, it will be appreciated that the film stack associated with MTJ₁ may be reversed instead of the film stack associated with MTJ₂ stack, in which case the current produced in the one or more write operations to achieve the target logical state in the MLC shown in FIG. 5 may be appropriately modified. Furthermore, although the MLC shown in FIGS. 4 and 5 and described above include two MTJ structures (i.e., MTJ₁ and MTJ₂), those skilled in the pertinent art will appreciate that the designs and techniques disclosed herein may be used in any suitable MLC having multiple MTJ structures (e.g., an MLC having two, three, or more MTJ structures).

Figure 6:
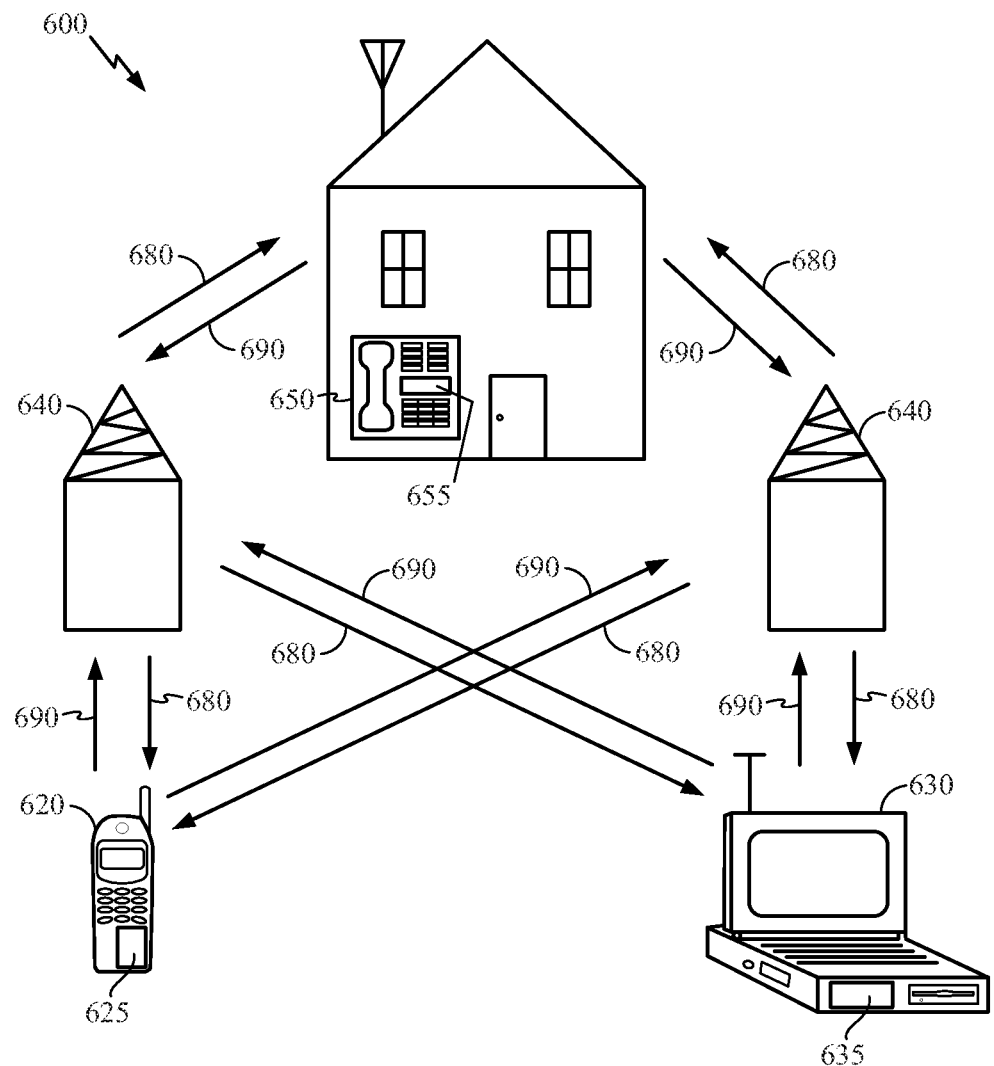
FIG. 6 illustrates an exemplary wireless communication system that may employ the MLCs that use multiple MTJ structures having one or more layers with varying thickness as disclosed herein, according to one exemplary embodiment.

According to one exemplary embodiment, FIG. 6 illustrates an exemplary wireless communication system 600 that may employ the MLCs that use multiple MTJ structures having one or more layers with varying thickness as disclosed in further detail above. FIG. 6 illustrates an exemplary wireless communication system 600 that may employ the exemplary buffer allocation techniques described herein. For purposes of illustration, FIG. 6 shows three remote units 620, 630, and 650 and two base stations 640. Those skilled in the pertinent art will recognize that other wireless communication systems in accordance with the exemplary embodiments described herein may have more or fewer remote units and/or base stations without departing from the scope or spirit of the exemplary embodiments described herein. In one embodiment, the remote units 620, 630, and 650 may include respective MRAM and/or STT MRAM memory devices 625, 635, and 655, wherein the MRAM and/or STT MRAM memory devices 625, 635, and 655 may include the MLCs described herein that use multiple MTJ structures having one or more layers with varying thickness. In one embodiment, as shown in FIG. 6, one or more forward link signals 680 may be used to communicate data from the base stations 640 to the remote units 620, 630, and 650 and one or more reverse link signals 690 may be used to communicate data from the remote units 620, 630, and 650 to the base stations 640.

In the exemplary embodiment shown in FIG. 6, the remote unit 620 may comprise a mobile telephone, the remote unit 630 may comprise a portable computer, and the remote unit 650 may comprise a fixed location remote unit in a wireless local loop system (e.g., meter reading equipment). In various embodiments, however, one or more of the remote units 620, 630, and 650 may comprise a mobile phone, a handheld personal communication systems unit, a portable data unit, a personal data assistant, a personal digital assistant, a navigation device (e.g., a GPS-enabled or location-aware device), a set top box, a music player, a video player, an entertainment unit, a fixed location data unit, a computer, or any other device or combination of devices that can suitably store, retrieve, communicate, or otherwise process data and/or computer-executable instructions. Although FIG. 6 illustrates remote units 620, 630, and 650 according to the teachings and embodiments disclosed herein, those skilled in the pertinent art will appreciate that the disclosure shall not be limited to these exemplary illustrated remote units 620, 630, and 650. Accordingly, various embodiments may be suitably employed or otherwise implemented in any suitable device that has a magnetic memory such as MRAM or STT MRAM.

Those skilled in the pertinent art will appreciate that information and signals may be represented using any of a variety of different technologies and techniques. For example, data, computer-executable instructions, commands, information, signals, bits, symbols, and chips that may be referenced throughout the above description may be represented by voltages, currents, electromagnetic waves, magnetic fields or particles, optical fields, particles, or any combination thereof.

Further, many embodiments may be described in terms of sequences of actions to be performed by, for example, elements of a computing device. It will be recognized that various actions described herein can be performed by specific circuits (e.g., an application specific integrated circuit), computer-executable instructions executed by one or more processors, or any combination thereof. Additionally, these sequence of actions described herein can be considered to be embodied entirely within any form of computer readable storage medium having stored therein a corresponding set of computer-executable instructions that upon execution would cause an associated processor to perform the functionality described herein. Thus, the various exemplary aspects disclosed herein may be embodied in a number of different forms, all of which have been contemplated to be within the scope or spirit of the claimed subject matter. In addition, for each of the embodiments described herein, the corresponding form of any such embodiments may be described herein as, for example, "logic configured to" perform the described action.

Further, those skilled in the pertinent art will appreciate that the various illustrative logical blocks, modules, circuits, algorithms, and steps described in connection with the embodiments disclosed herein may be implemented as electronic hardware, computer software, or any suitable combinations thereof. To clearly illustrate this interchangeability of hardware and software, various illustrative components, blocks, modules, circuits, algorithms, and steps have been described above in terms of their general functionality. Whether such functionality is implemented in hardware or software depends upon the particular application and design constraints, and those skilled in the pertinent art may implement the described functionality in various ways to suit each particular application, but such implementation decisions should not be interpreted as causing a departure from the scope or spirit of the exemplary aspects and embodiments disclosed herein.

The methods, sequences and/or algorithms described in connection with the embodiments disclosed herein may be embodied directly in hardware, in a software module executed by a processor, or any suitable combination thereof. Software modules may reside in memory controllers, DDR memory, RAM memory, flash memory, ROM memory, EPROM memory, EEPROM memory, registers, hard disks, removable disks, CD-ROMs, or any other known or future-developed storage medium. An exemplary storage medium is coupled to the processor such that the processor can read information from, and write information to, the storage medium. In the alternative, the storage medium may be integral to the processor.

Accordingly, one exemplary embodiment may include a computer-readable medium embodying computer-executable instructions to perform a method for forming a multi-level memory device, writing a multi-level memory device, or any other suitable method disclosed or otherwise enabled herein. Accordingly, the exemplary aspects and embodiments disclosed herein are not limited to the illustrated examples and any means for performing the functionality described herein are included in the exemplary aspects and embodiments disclosed herein.

The foregoing disclosed methods may be designed and configured into GDSII, GERBER, or other suitable computer files, which may be stored on a computer-readable medium. These computer files may in turn be provided to fabrication handlers who fabricate devices based on these files, wherein the resulting products are semiconductor wafers that may then be cut into semiconductor die and packaged into a semiconductor chip, wherein the semiconductor die or semiconductor chip may integrate, correspond to, be employed in, or otherwise used in association with the MLCs described above. Furthermore, MRAM and multi-memory cells as described in the disclosure may operate with microprocessors or other suitable logic circuitry, wherein the MRAM and multi-memory cells described herein may be integrated into devices that employ the microprocessors or other suitable logic circuitry. For example, the MRAM and multi-memory cells may be part of a communications device. Of course, the MRAM and multi-memory cells may include other types of circuitry without departing from the scope and spirit of the disclosure.

While the foregoing disclosure shows illustrative embodiments of an MLC using multiple MTJ structures having one or more layers with varying thicknesses, those skilled in the pertinent art will appreciate that various changes and modifications could be made herein without departing from the scope or spirit of the exemplary aspects and embodiments disclosed herein, as defined by the appended claims. The functions, steps, operations, and/or actions of the method claims in accordance with the exemplary aspects and embodiments disclosed herein need not be performed in any particular order. Furthermore, although elements of the exemplary aspects and embodiments disclosed herein may be described or claimed in the singular, the plural is contemplated unless limitation to the singular is explicitly stated.

What is claimed is:

1. A method for forming a multi-level memory device, comprising:
    using a single mask to pattern a first Magnetic Tunnel Junction (MTJ) element and a second MTJ element, wherein the first MTJ element is patterned between a first metal layer and a second metal layer and the second MTJ element is patterned between the second metal layer and a third metal layer;
    providing a conductive layer to flow current through the first MTJ element and the second MTJ element; and
    fabricating the first MTJ element and the second MTJ element such that a first barrier layer of the first MTJ element and a second barrier layer of the second MTJ element have different thicknesses.

2. The method of claim 1, wherein the second metal layer is formed from multiple electrically interconnected metal layers.

3. The method of claim 1, wherein the multi-level memory device has three or more MTJ elements, including at least the first MTJ element and the second MTJ element, that are serially connected.

4. The method of claim 1, wherein the first barrier layer and the second barrier layer are formed from magnesium oxide (MgO).

5. The method of claim 1, further comprising fabricating the first MTJ element and the second MTJ element such that the first barrier layer of the first MTJ element and the second barrier layer of second MTJ element have substantially identical area dimensions.

6. The method of claim 5, further comprising fabricating the first MTJ element and the second MTJ element such that a first free layer of the first MTJ element and a second free layer of the second MTJ element have different thicknesses and substantially identical area dimensions.

7. The method of claim 5, further comprising fabricating the first MTJ element and the second MTJ element such that a first free layer of the first MTJ element and a second free layer of the second MTJ element are formed from different materials and have substantially identical area dimensions.

8. The method of claim 1, further comprising adjusting the different thicknesses of the first barrier layer and the second barrier layer such that the second barrier layer has a resistance approximately two times a resistance of the first barrier layer when the first MTJ element and the second MTJ element have a symmetric state.

9. The method of claim 1, further comprising adjusting the different thicknesses of the first barrier layer and the second barrier layer such that the first barrier layer has a resistance approximately two times a resistance of the second barrier layer when the first MTJ element and the second MTJ element have a symmetric state.

10. The method of claim 1, wherein one or more of the first barrier layer associated with the first MTJ element or the second barrier layer associated with the second MTJ element is disposed above a pinned layer and below a free layer.

11. The method of claim 1, wherein one or more of the first barrier layer associated with the first MTJ element or the second barrier layer associated with the second MTJ element is disposed below a pinned layer and above a free layer.

12. The method of claim 1, wherein the multi-level memory device is integrated into at least one semiconductor die.

13. The method of claim 1, wherein the multi-level memory device is integrated into one or more of a set top box, a music player, a video player, an entertainment unit, a navigation device, a communications device, a personal digital assistant, a fixed location data unit, or a computer.

14. A multi-level memory device, comprising:
a first Magnetic Tunnel Junction (MTJ) element disposed between a first metal layer and a second metal layer, wherein the first MTJ element comprises a first barrier layer having a first thickness; and
a second MTJ element disposed between the second metal layer and a third metal layer, wherein the second MTJ element comprises a second barrier layer having a second thickness that is different from the first thickness of the first barrier layer.

15. The multi-level memory device of claim 14, wherein the second metal layer is formed from multiple electrically interconnected metal layers.

16. The multi-level memory device of claim 14, wherein the multi-level memory device has three or more MTJ elements, including at least the first MTJ element and the second MTJ element, that are serially connected.

17. The multi-level memory device of claim 14, wherein the first barrier layer and the second barrier layer are formed from magnesium oxide (MgO).

18. The multi-level memory device of claim 14, wherein the first barrier layer of the first MTJ element and the second barrier layer of the second MTJ element have substantially identical area dimensions.

19. The multi-level memory device of claim 18, wherein a first free layer of the first MTJ element and a second free layer of the second MTJ element have different thicknesses and substantially identical area dimensions.

20. The multi-level memory device of claim 18, wherein a first free layer of the first MTJ element and a second free layer of the second MTJ element are formed from different materials and have substantially identical area dimensions.

21. The multi-level memory device of claim 14, wherein the second thickness of the second barrier layer is greater than the first thickness of the first barrier layer such that the second barrier layer has a resistance approximately two times a resistance of the first barrier layer when the first MTJ element and the second MTJ element have a symmetric state.

22. The multi-level memory device of claim 14, wherein the first thickness of the first barrier layer is greater than the second thickness of the second barrier layer such that the first barrier layer has a resistance approximately two times a resistance of the second barrier layer when the first MTJ element and the second MTJ element have a symmetric state.

23. The multi-level memory device of claim 14, wherein one or more of the first barrier layer associated with the first MTJ element or the second barrier layer associated with the second MTJ element is disposed above a pinned layer and below a free layer.

24. The multi-level memory device of claim 14, wherein one or more of the first barrier layer associated with the first MTJ element or the second barrier layer associated with the second MTJ element is disposed below a pinned layer and above a free layer.

25. The multi-level memory device of claim 14, integrated into at least one semiconductor die.

26. The multi-level memory device of claim 14, integrated into one or more of a set top box, a music player, a video player, an entertainment unit, a navigation device, a communications device, a personal digital assistant, a fixed location data unit, or a computer.

27. An apparatus for forming a multi-level memory device, comprising:
means for using a single mask to pattern a first Magnetic Tunnel Junction (MTJ) between a first metal layer and a second metal layer and a second MTJ element between the second metal layer and a third metal layer;
means for providing a conductive layer to flow current through the first MTJ element and the second MTJ element; and
means for fabricating the first MTJ element and the second MTJ element such that a first barrier layer of the first MTJ element and a second barrier layer of the second MTJ element have different thicknesses.

28. The apparatus of claim 27, wherein the second metal layer is formed from multiple electrically interconnected metal layers.

29. The apparatus of claim 27, wherein the multi-level memory device has three or more MTJ elements, including at least the first MTJ element and the second MTJ element, that are serially connected.

30. The apparatus of claim 27, wherein the first barrier layer and the second barrier layer are formed from magnesium oxide (MgO).

31. The apparatus of claim 27, further comprising means for fabricating the first MTJ element and the second MTJ element such that the first barrier layer of the first MTJ element and the second barrier layer of second MTJ element have substantially identical area dimensions.

32. The apparatus of claim 31, further comprising means for fabricating the first MTJ element and the second MTJ element such that a first free layer of the first MTJ element and a second free layer of the second MTJ element have different thicknesses and substantially identical area dimensions.

33. The apparatus of claim 31, further comprising means for fabricating the first MTJ element and the second MTJ element such that a first free layer of the first MTJ element and a second free layer of the second MTJ element are formed from different materials and have substantially identical area dimensions.

34. The apparatus of claim 27, further comprising means for adjusting the different thicknesses of the first barrier layer and the second barrier layer such that the second barrier layer has a resistance approximately two times a resistance of the first barrier layer when the first MTJ element and the second MTJ element have a symmetric state.

35. The apparatus of claim 27, further comprising means for adjusting the different thicknesses of the first barrier layer and the second barrier layer such that the first barrier layer has a resistance approximately two times a resistance of the second barrier layer when the first MTJ element and the second MTJ element have a symmetric state.

36. The apparatus of claim 27, wherein one or more of the first barrier layer associated with the first MTJ element or the second barrier layer associated with the second MTJ element is disposed above a pinned layer and below a free layer.

37. The apparatus of claim 27, wherein one or more of the first barrier layer associated with the first MTJ element or the second barrier layer associated with the second MTJ element is disposed below a pinned layer and above a free layer.

38. The apparatus of claim 27, integrated into at least one semiconductor die.

39. The apparatus of claim 27, integrated into one or more of a set top box, a music player, a video player, an entertainment unit, a navigation device, a communications device, a personal digital assistant, a fixed location data unit, or a computer.

40. A method for forming a multi-level memory device, comprising:
 a first step for using a single mask to pattern a first Magnetic Tunnel Junction (MTJ) element and a second MTJ element, wherein the first MTJ element is patterned between a first metal layer and a second metal layer and the second MTJ element is patterned between the second metal layer and a third metal layer;
 a second step for providing a conductive layer to flow current through the first MTJ element and the second MTJ element; and
 a third step for fabricating the first MTJ element and the second MTJ element such that a first barrier layer of the first MTJ element and a second barrier layer of the second MTJ element have different thicknesses.

41. A method for writing a multi-level memory device having a first Magnetic Tunnel Junction (MTJ) element disposed between a first metal layer and a second metal layer and a second MTJ element disposed between the second metal layer and a third metal layer, wherein the first MTJ element comprises a first barrier layer having a first thickness and wherein the second MTJ element comprises a second barrier layer having a second thickness that is different from the first thickness of the first barrier layer, the method comprising:
 determining a target state for the multi-level memory device; and
 flowing one or more currents through the first MTJ element and the second MTJ element to establish the target state.

42. The method of claim 41, wherein if the target state is a logical '00' or a logical '11', the one or more currents comprise one current sufficient to switch the first MTJ element and the second MTJ element to a symmetric magnetic orientation.

43. The method of claim 41, wherein if the target state is a logical '01' or a logical '10', the one or more currents comprise:
 a first current sufficient to switch the first MTJ element and the second MTJ element to a symmetric magnetic orientation, and
 a second current that is smaller than the first current and sufficient to further switch only one of the first MTJ element or the second MTJ element.

44. The method of claim 41, wherein a first stack of the first MTJ element is reversed from a second stack of the second MTJ element.

45. The method of claim 44, wherein if the target state is a logical '01' or a logical '10', the one or more currents comprise one current sufficient to switch the first MTJ element and the second MTJ element to an asymmetric magnetic orientation.

46. The method of claim 44, wherein if the target state is a logical '00' or a logical '11', the one or more currents comprise:
 a first current sufficient to switch the first MTJ element and the second MTJ element to an asymmetric magnetic orientation, and
 a second current that is smaller than the first current and sufficient to further switch only one of the first MTJ element or the second MTJ element.

47. The method of claim 41, wherein the multi-level memory device is integrated into at least one semiconductor die.

48. The method of claim 41, wherein the multi-level memory device is integrated into one or more of a set top box, a music player, a video player, an entertainment unit, a navigation device, a communications device, a personal digital assistant, a fixed location data unit, or a computer.

49. An apparatus for writing a multi-level memory device having a first Magnetic Tunnel Junction (MTJ) element disposed between a first metal layer and a second metal layer and a second MTJ element disposed between the second metal layer and a third metal layer, wherein the first MTJ element comprises a first barrier layer having a first thickness and wherein the second MTJ element comprises a second barrier layer having a second thickness that is different from the first thickness of the first barrier layer, the apparatus comprising:
 means for determining a target state for the multi-level memory device; and
 means for flowing one or more currents through the first MTJ element and the second MTJ element to establish the target state.

50. The apparatus of claim 49, wherein if the target state is a logical '00' or a logical '11', the one or more currents comprise one current sufficient to switch the first MTJ element and the second MTJ element to a symmetric magnetic orientation.

51. The apparatus of claim 49, wherein if the target state is a logical '01' or a logical '10', the one or more currents comprise:
 a first current sufficient to switch the first MTJ element and the second MTJ element to a symmetric magnetic orientation, and
 a second current that is smaller than the first current and sufficient to further switch only one of the first MTJ element or the second MTJ element.

52. The apparatus of claim 49, wherein a first stack of the first MTJ element is reversed from a second stack of the second MTJ element.

53. The apparatus of claim 52, wherein if the target state is a logical '01' or a logical '10', the one or more currents comprise one current sufficient to switch the first MTJ element and the second MTJ element to an asymmetric magnetic orientation.

54. The apparatus of claim 52, wherein if the target state is a logical '00' or a logical '11', the one or more currents comprise:
 a first current sufficient to switch the first MTJ element and the second MTJ element to an asymmetric magnetic orientation, and a second current that is smaller than the first current and sufficient to further switch only one of the first MTJ element or the second MTJ element.

55. The apparatus of claim 49, integrated into at least one semiconductor die.

56. The apparatus of claim 49, integrated into one or more of a set top box, a music player, a video player, an entertainment unit, a navigation device, a communications device, a personal digital assistant, a fixed location data unit, or a computer.

57. A computer-readable storage medium storing computer-executable instructions for writing a multi-level memory device having a first Magnetic Tunnel Junction (MTJ) element disposed between a first metal layer and a second metal layer and a second MTJ element disposed between the second metal layer and a third metal layer, wherein the first MTJ element comprises a first barrier layer having a first thickness and wherein the second MTJ element comprises a second barrier layer having a second thickness that is different from the first thickness of the first barrier layer, wherein executing the computer-executable instructions on a processor causes the processor to:
  determine a target state for the multi-level memory device; and
  flow one or more currents through the first MTJ element and the second MTJ element to establish the target state.

58. The computer-readable storage medium of claim 57, wherein if the target state is a logical '00' or a logical '11', the one or more currents comprise one current sufficient to switch the first MTJ element and the second MTJ element to a symmetric magnetic orientation.

59. The computer-readable storage medium of claim 57, wherein if the target state is a logical '01' or a logical '10', the one or more currents comprise:
  a first current sufficient to switch the first MTJ element and the second MTJ element to a symmetric magnetic orientation, and
  a second current that is smaller than the first current and sufficient to further switch only one of the first MTJ element or the second MTJ element.

60. The computer-readable storage medium of claim 57, wherein a first stack of the first MTJ element is reversed from a second stack of the second MTJ element.

61. The computer-readable storage medium of claim 60, wherein if the target state is a logical '01' or a logical '10', the one or more currents comprise one current sufficient to switch the first MTJ element and the second MTJ element to an asymmetric magnetic orientation.

62. The computer-readable storage medium of claim 60, wherein if the target state is a logical '00' or a logical '11', the one or more currents comprise:
  a first current sufficient to switch the first MTJ element and the second MTJ element to an asymmetric magnetic orientation, and
  a second current that is smaller than the first current and sufficient to further switch only one of the first MTJ element or the second MTJ element.

63. The computer-readable storage medium of claim 57, integrated into at least one semiconductor die.

64. The computer-readable storage medium of claim 57, integrated into one or more of a set top box, a music player, a video player, an entertainment unit, a navigation device, a communications device, a personal digital assistant, a fixed location data unit, or a computer.

65. A method for writing a multi-level memory device having a first Magnetic Tunnel Junction (MTJ) element disposed between a first metal layer and a second metal layer and a second MTJ element disposed between the second metal layer and a third metal layer, wherein the first MTJ element comprises a first barrier layer having a first thickness and wherein the second MTJ element comprises a second barrier layer having a second thickness that is different from the first thickness of the first barrier layer, the method comprising:
  a first step for determining a target state for the multi-level memory device; and
  a second step for flowing one or more currents through the first MTJ element and the second MTJ element to establish the target state.

* * * * *